(12) United States Patent
Hwang et al.

(10) Patent No.: US 8,370,703 B2
(45) Date of Patent: Feb. 5, 2013

(54) INFORMATION ENCODING METHOD, INFORMATION DECODING METHOD, RECORDING/REPRODUCING APPARATUS, AND INFORMATION STORAGE MEDIUM

(75) Inventors: Sung-hee Hwang, Suwon-si (KR);
In-oh Hwang, Seongnam-si (KR);
Kyung-geun Lee, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 208 days.

(21) Appl. No.: 12/833,380

(22) Filed: Jul. 9, 2010

(65) Prior Publication Data

US 2011/0010604 A1    Jan. 13, 2011

Related U.S. Application Data

(60) Provisional application No. 61/224,108, filed on Jul. 9, 2009.

(30) Foreign Application Priority Data

Sep. 4, 2009    (KR) .................. 10-2006-0083637

(51) Int. Cl.
*H03M 13/00*    (2006.01)
(52) U.S. Cl. ........................................... 714/755
(58) Field of Classification Search .................. None
See application file for complete search history.

(56) References Cited

U.S. PATENT DOCUMENTS

| | | | |
|---|---|---|---|
| 6,216,245 B1 | 4/2001 | Noda | |
| 6,367,049 B1 | 4/2002 | Van Dijk et al. | |
| 7,254,800 B1* | 8/2007 | Trimberger | 716/117 |
| 8,171,378 B2* | 5/2012 | Choi et al. | 714/764 |
| 2005/0135803 A1* | 6/2005 | Lee et al. | 398/1 |
| 2006/0120685 A1 | 6/2006 | Sako | |
| 2009/0044077 A1* | 2/2009 | Choi et al. | 714/764 |

FOREIGN PATENT DOCUMENTS

| | | |
|---|---|---|
| JP | 06-302103 | 10/1994 |
| WO | WO 2008/018694 | 2/2008 |

OTHER PUBLICATIONS

International Search Report issued on Jan. 31, 2011, in corresponding PCT Application No. PCT/KR2010/004471 (9 pages).

* cited by examiner

*Primary Examiner* — Guerrier Merant
(74) *Attorney, Agent, or Firm* — NSIP Law

(57) ABSTRACT

A method of encoding information and a method of decoding information, and an apparatus to perform one or both methods, and an information storage medium on which to store the information, the method of encoding the information including encrypting data between two ECC-encoding operations, and the method of decoding the information including decrypting data between two ECC-decoding operations.

11 Claims, 12 Drawing Sheets

FIRST ECC BLOCK

SECOND ECC BLOCK
(FIRST CASE)

SECOND ECC BLOCK
(SECOND CASE)

SECOND ECC BLOCK
(THIRD CASE)

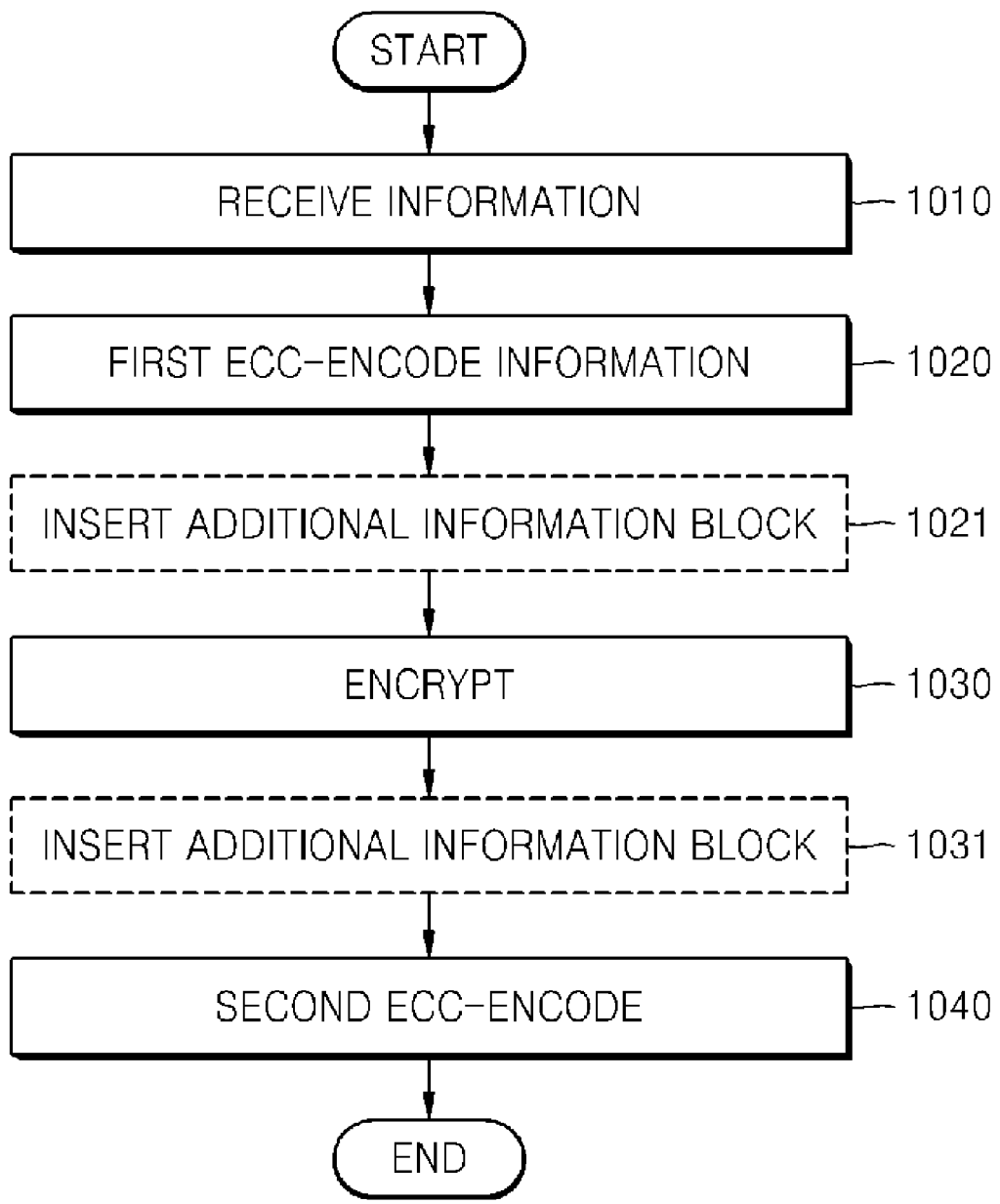

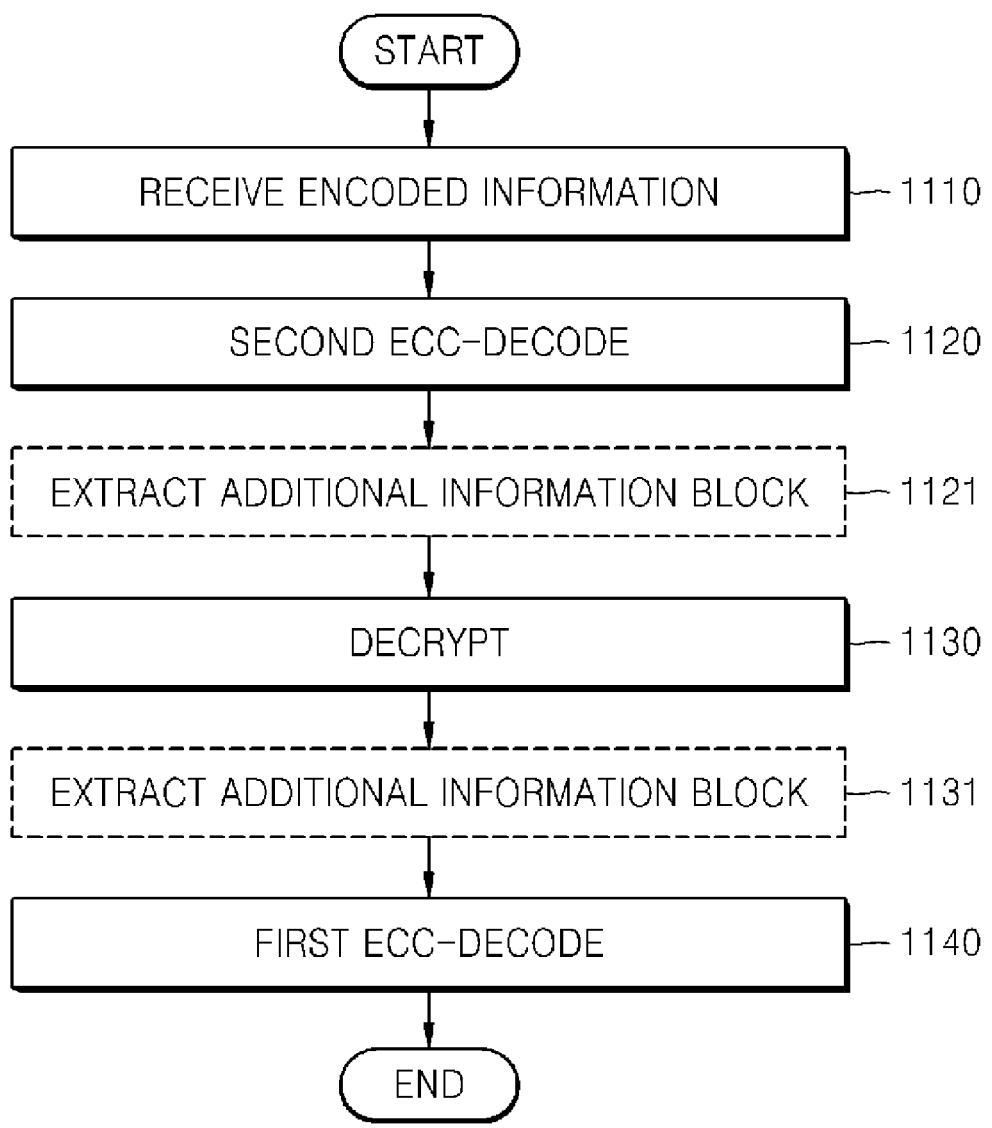

INFORMATION ENCODING METHOD, INFORMATION DECODING METHOD, RECORDING/REPRODUCING APPARATUS, AND INFORMATION STORAGE MEDIUM

CROSS-REFERENCE TO RELATED APPLICATIONS

This application claims the benefit under 35 U.S.C. §119(e) of U.S. Patent Application No. 61/224,108, filed on Jul. 9, 2009, in the United States Patent and Trademark Office, and also the benefit under 35 U.S.C. §119(a) of Korean Patent Application No. 10-2009-0083637, filed on Sep. 4, 2009, in the Korean Intellectual Property Office, the disclosure of which is incorporated herein in its entirety by reference.

BACKGROUND

1. Field of the Invention

The present general inventive concept relates to information storage media, and, more particularly, to an information encoding method, an information decoding method, a recording/reproducing apparatus, and an information storage medium.

2. Description of the Related Art

Multi-layer information storage media having high density, which surpass an existing density and an existing number of layers in storage media that have been previously designed, are being developed. When such a multi-layer information storage medium that surpasses the previously existing density and number of layers is loaded on an apparatus typically used for a previously existing information storage medium, it is desirable to prevent the apparatus from recording and reproducing information on and from the newly developed multi-later information storage medium that surpasses the previously existing density and number of layers. This is because when a new information storage medium is developed, it usually inherits most contents of standards of existing information storage media, and thus, when a new multi-layer information storage medium having high density is loaded on an apparatus typically used for the previously existing existing information storage medium, the apparatus may reproduce or record information from or on the new multi-layer information storage medium in an erroneous fashion. In other words, since the apparatus is not completely aware of the new multi-layer information storage medium, the reproducing or recording of information may confuse a user, or data may be wrongly recorded on, or recorded data may be deleted from, the new multi-layer information storage medium.

FIG. 1 is a diagram illustrating a related art.

Referring to FIG. 1, a drive 1.0 110 is a recording/reproducing apparatus that follows a previously existing standard, and a drive 2.0 120 is a recording/reproducing apparatus that follows a new standard. A disk 2.0 100 manufactured to be used in the drive 2.0 120 has an encoding data format 2.0. As described above, recording/reproduction is normally performed on the disk 2.0 100 in the drive 2.0 120, but not in the drive 1.0 100.

Accordingly, information may be encrypted so as to avoid a risk that may occur when a new multi-layer information storage medium having high density is loaded on a conventional apparatus other than an apparatus designed to record or reproduce information on or from the new multi-layer information storage medium.

SUMMARY

Example embodiments of the present general inventive concept provide an information encoding method, an information decoding method, a recording/reproducing apparatus, and an information storage medium, which prevent a conventional apparatus, to which a new standard is not applied, from recording or reproducing data on or from a disk, to which a data encoding format according to the new standard is applied, when the disk is loaded on the conventional apparatus.

Additional features and utilities of the present general inventive concept will be set forth in part in the description which follows and, in part, will be obvious from the description, or may be learned by practice of the general inventive concept.

The foregoing and/or other features and utilities of the present general inventive concept may be achieved by providing a recording apparatus to record information on an information storage medium, the apparatus including a pickup unit to transmit information to the information storage medium, and a controller to first error correction code (ECC)-encode the information, encrypt at least a portion of the first ECC-encoded information, second ECC-encode the encrypted information, and control the pickup unit to record the second ECC-encoded information on the information storage medium.

The controller may insert additional information to the first ECC-encoded information before or after encrypting the at least a portion of the first ECC-encoded information.

The information may include an address unit number.

The foregoing and/or other features and utilities of the present general inventive concept may also be achieved by providing a reproducing apparatus to reproduce information from an information storage medium, the reproducing apparatus including a pickup unit to read information from the information storage medium, and a controller to control the pickup unit to read second ECC-encoded information from the information storage medium, second ECC-decode the second ECC-encoded information, and decrypt the second ECC-decoded information.

The controller may extract additional information from the second ECC-decoded information before or after decrypting the second ECC-decoded information.

The controller may first ECC-decode the decrypted information.

The foregoing and/or other features and utilities of the present general inventive concept may also be achieved by providing a method of encoding information, the method including first ECC-encoding the information, encrypting at least a portion of the first ECC-encoded information; and second ECC-encoding the encrypted information.

The encrypting may include inserting additional information to the first ECC-encoded information before or after encrypting the at least a portion of the first ECC-encoded information.

The information may include an address unit number.

The foregoing and/or other features and utilities of the present general inventive concept may also be achieved by providing a method of decoding information, the method including second ECC-decoding second ECC-encoded information; and decrypting the second ECC-decoded information.

The decrypting may include extracting additional information from the second ECC-decoded information before or after decrypting the second ECC-decoded information.

The method may further include first ECC-decoding the decrypted information.

The foregoing and/or other features and utilities of the present general inventive concept may also be achieved by providing an information storage medium having data recorded thereon, the data being obtained by first ECC-encoding information, encrypting at least a portion of the first ECC-encoded information, and second ECC-encoding the encrypted information, wherein the encrypting is performed before the second ECC-encoding.

Additional information may be inserted into the first ECC-encoded information before or after the at least a portion of the first ECC-encoded information is encrypted.

The information may include an address unit number.

The foregoing and/or other features and utilities of the present general inventive concept may also be achieved by providing a method of encoding information, the method including encrypting data between two ECC-encoding operations, and storing the information on an information storage medium.

The method may further include inserting additional information between the two ECC-encoding operations before or after encrypting the data.

The foregoing and/or other features and utilities of the present general inventive concept may also be achieved by providing a method of decoding information, the method including decrypting data between two ECC-decoding operations, and processing the information after completing the two ECC-decoding operations.

BRIEF DESCRIPTION OF THE DRAWINGS

These and/or other features and advantages of the present general inventive concept will become apparent and more readily appreciated from the following description of various exemplary embodiments, taken in conjunction with the accompanying drawings of which:

FIG. 10 is a flowchart illustrating an information encoding method according to an embodiment of the present general inventive concept;

FIG. 11 is a flowchart illustrating an information decoding method according to an embodiment of the present general inventive concept;

DETAILED DESCRIPTION OF THE EMBODIMENTS

Figure 1:
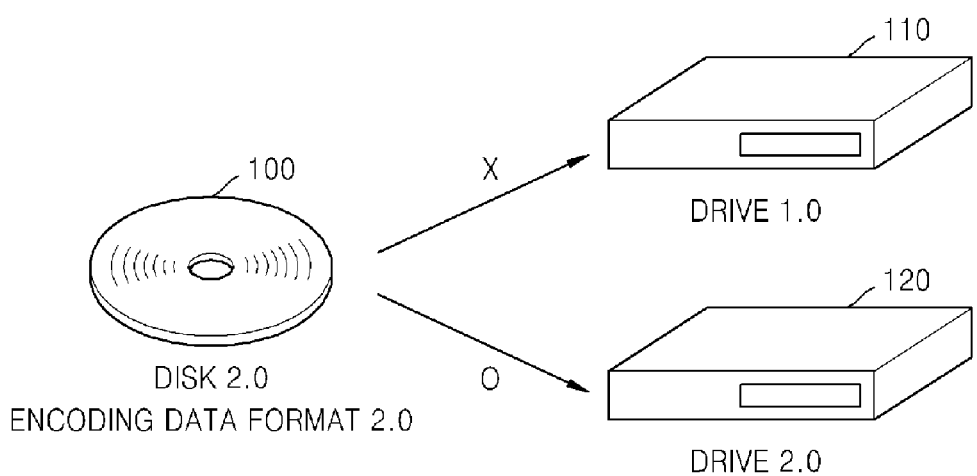
FIG. 1 is a diagram illustrating a related art.

Reference will now be made in detail to various exemplary embodiments of the present general inventive concept, examples of which are illustrated in the accompanying drawings, wherein like reference numerals refer to like elements throughout. The embodiments are described below in order to explain the present general inventive concept by referring to the figures.

Figure 2:
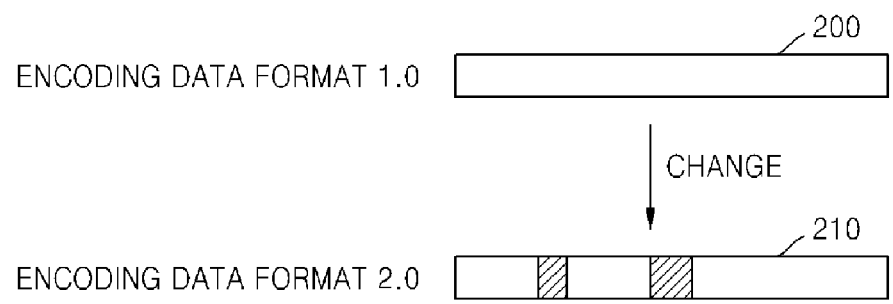
FIG. 2 is a diagram illustrating an aspect of an embodiment of the present general inventive concept.

FIG. 2 is a diagram illustrating an aspect of an embodiment of the present general inventive concept.

Referring to FIG. 2, it is assumed for the purpose of this description that a standard of a conventional information storage medium is an encoding data format 1.0 200, and an encoding data format 2.0 210 applied to a more newly developed multi-layer information storage medium having high density uses a portion of the encoding data format 1.0 200. In this case, according to this exemplary embodiment of the present general inventive concept, data of the encoding data format 2.0 210 may be configured by changing a part of the data of the encoding data format 1.0 200 so that the encoding data format 2.0 210 may not be properly read by an apparatus which conventionally uses a previously existing information storage medium when the new multi-layer information storage medium is loaded on that apparatus.

In the description of various exemplary embodiments of the present general inventive concept, an apparatus which conventionally uses a previously existing conventional information storage medium, other than a newly developed storage medium to which a data encoding format according to a newly developed standard is applied, is typically referred to as a conventional apparatus.

Figure 3A:
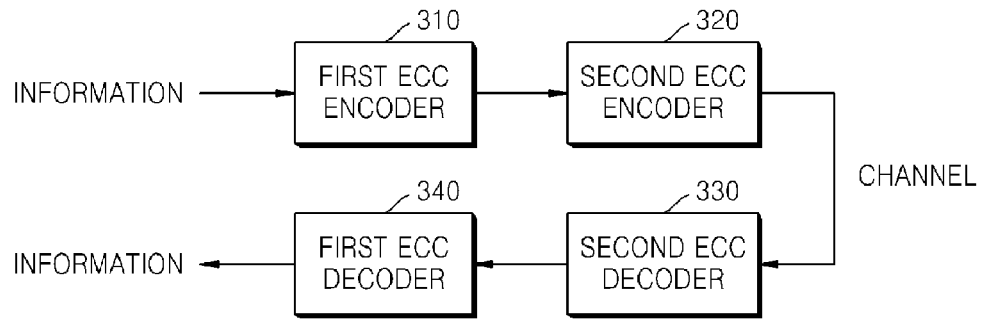
FIG. 3A is a block diagram illustrating a general error correction code (ECC) encoding/decoding system, which performs ECC twice, according to an embodiment of the present general inventive concept.

FIG. 3A is a block diagram illustrating a general error correction code (ECC) encoding/decoding system, which performs ECC twice, according to an embodiment of the present general inventive concept.

Referring to FIG. 3A, in a case in which information is referred to as first message data, a first message data block formed of a plurality of pieces of the first message data may be encoded by a first ECC encoder 310, and, thus, a first ECC block formed of first ECC codewords may be generated. The first ECC block may be combined with an additional information block to generate a second message data block. The second message data block may be encoded by a second ECC encoder 320, and, thus, a second ECC block formed of second ECC codewords may be generated. The second ECC block may be transmitted through a channel to be decoded by a second ECC decoder 330, and thus the second message data block may be generated through that decoding process. The first ECC block may be generated by extracting the additional information block from the second message data block. The first ECC block may be decoded by a first ECC decoder 340, and, thus, the first message data block may be generated through that decoding process. The information referred to as the first message data may be extracted from the first message data block. For the purpose of this description, being transmitted through a channel may refer to information being transmitted to an information storage medium to be recorded, or recorded information being read and received from the information storage medium, and so on.

According to this embodiment, in the error correction code (ECC) encoding/decoding system, a portion of the information referred to as the first message data, a part of the first ECC codeword, or the entirety of the information may be changed, for example, before the second ECC encoding, so as to prevent a conventional apparatus from reading the information.

Figure 3B:
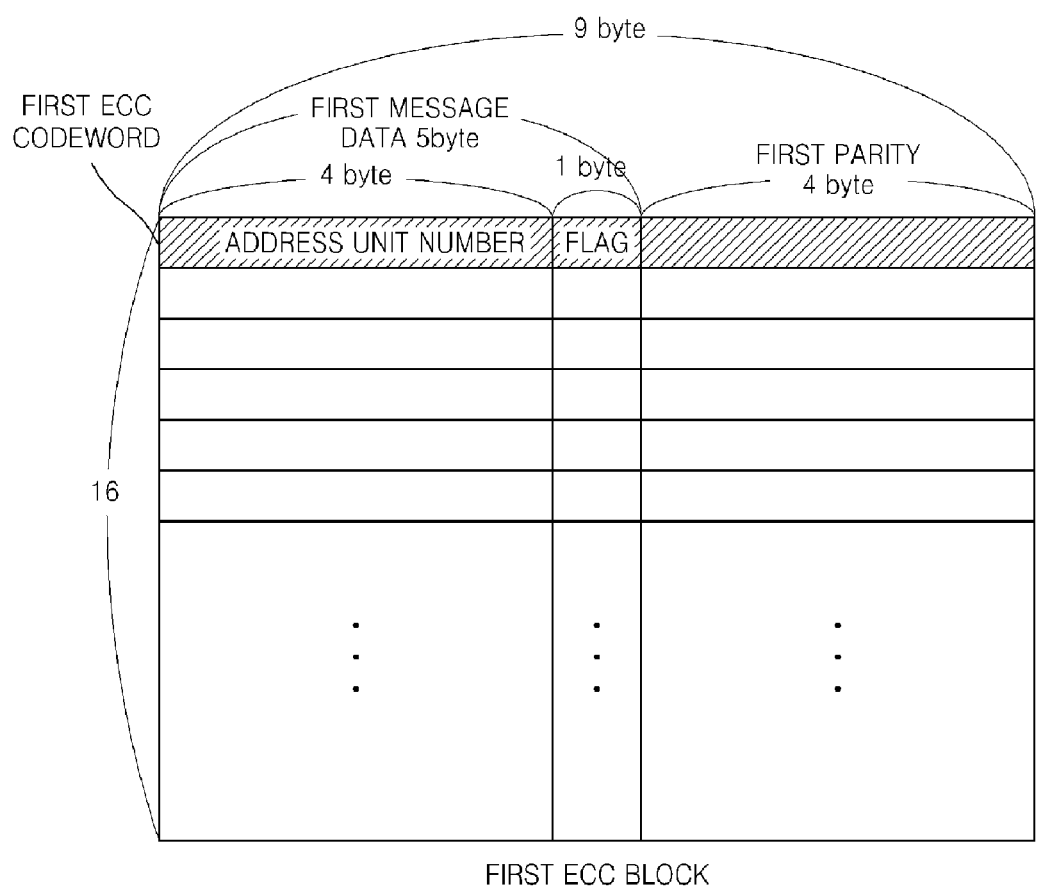
FIG. 3B is a diagram illustrating a first ECC block encoded by a first ECC encoder of FIG. 3A.

FIG. 3B is a diagram illustrating the first ECC block encoded by the first ECC encoder 310 of FIG. 3A.

Referring to FIG. 3B, the previously discussed information of the first message data may denote an address unit number of 4 bytes. The first message data may be formed of a total of 5 bytes, including the address unit number of 4 bytes and flag information of 1 byte. 16 pieces of the first message data of 5 bytes may form the first message data block of 16×5 bytes. A first ECC (Reed-Solomon (RS) (9,5,5) code) may be performed on the first message data block to form the first ECC block. In other words, an address field having a length of 9 bytes and prepared by encoding each piece of the first message data of the first message data block according to the RS (9,5,5) code may become the first ECC codeword. The 16 first ECC codewords may form the first ECC block of 16×9 bytes.

Figure 3C:
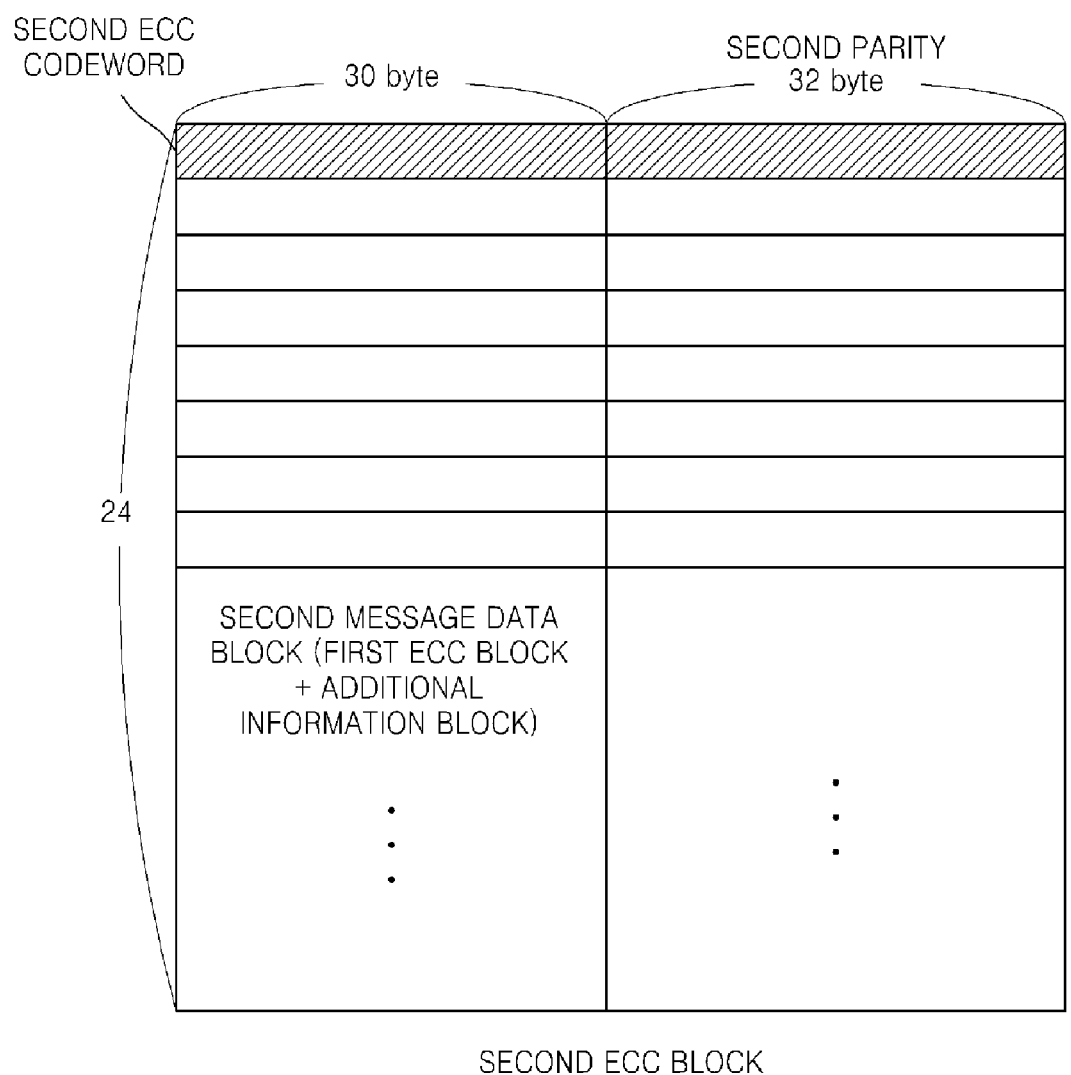
FIG. 3C is a diagram illustrating a second ECC block encoded by a second ECC encoder of FIG. 3A.

FIG. 3C is a diagram illustrating the second ECC block encoded by the second ECC encoder 320 of FIG. 3A.

The second message data block may denote an access block of 24×30 bytes generated as the additional information block formed of 32×18 bytes of control data is combined with the first ECC block.

The second ECC codeword may denote a burst indication subcode (BIS) codeword having a length of 62 bytes and prepared by attaching parity data of 32 bytes to message data of 30 bytes through encoding according to the second ECC (RS (62,30, 33) code). A BIS block of 24×62 bytes formed as the 24 second ECC codewords gather may become the second ECC block.

According to a method of encrypting the information of the first message data, an original value may be changed to another value by adding or subtracting a designated value or by using an exclusive-OR operation. Here, an amount of the information to be encrypted may be encrypted to exceed an error correction range of the first ECC. However, in the newly developed standard, a decrypt unit may be included in a drive used to read/write data in the newly developed standard so as to decrypt the encrypted information, and, thus, an error correction of the first ECC may be successfully performed. Meanwhile, a conventional apparatus drive using an older standard does not have a decrypt unit to decrypt the encrypted information, and, thus, the error correction of the first ECC will fail. Accordingly, the conventional apparatus drive using an older standard is unable to properly reproduce address information, and, thus, is unable to record information on or reproduce information from a disk that employs the newly developed standard.

The concept discussed above will be described below in more detail.

According to the RS (9,5,5) code used in the first ECC, a maximum number of correctable error symbols is 2 in a general error correction. Up to 4 symbols are correctable in an erasure correction. Here, in an RS (N,K,d) code, N denotes a length of codeword, K denotes a length of message data, and d denotes a length of parity +1. Accordingly, in the RS (9,5,5) code, a codeword of 9 symbols (a unit of symbol may be a byte) is encoded in such a way that a length of message data is 5 symbols and a length of parity is 4 symbols. If 2 symbols or less are changed in the RS (9,5,5) code, original values of changed symbols may be determined through error correction in the first ECC, and thus, the information may not be protected. However, if more than 2 symbols are changed, the error correction of the first ECC may not be performed or may be wrongly performed, and thus, the correct information may not be obtained. If 3 or 4 symbols are changed in the RS (9,5,5) code, a total of 48 or 64 symbols are changed in one first ECC block formed of 16 ECC codewords, and thus, 48 or 64 symbols are changed in the second ECC block formed of 24 RS (62,30,33) codes. Since the second ECC block is formed of 24 second ECC codewords, 2 to 3 symbols are changed on average in the RS (62,30,33) code. Here, a number of changed symbols may be different according to an interleaving method, but 4 to 6 symbols are changed per one second ECC codeword even when the average symbols are changed twice. In the RS (62,30,33) code used by the second ECC encoder 320, errors of up to 16 symbols may be corrected, and thus, errors of 4 to 6 symbols may be sufficiently corrected. As described above, the information is encrypted before the second ECC encoding. Accordingly, when the disk having recorded thereon the information encrypted as described above is loaded on a drive of a conventional apparatus, even if the RS (62,30,33) code constituting the second ECC is better than the RS (9,5,5) code constituting the first ECC, the information before encryption can be prevented from being obtained because error correction of the first ECC is not successful despite a successful error correction of the second ECC since encrypted symbols are the message data of the second ECC.

If the information is encrypted after the second ECC, the encrypted information is considered to be an error in an aspect of the second ECC. Thus, when data recorded on the disk is reproduced in the drive of a conventional apparatus, the changed information is corrected by the second ECC since an error correction performance is excellent. Accordingly as a result, the encrypted information is correctly decrypted.

Thus, according to the this embodiment of the present general inventive concept, the information should be encrypted before the second ECC.

FIGS. 4A through 4D are diagrams illustrating cases of performing encryption of information, according to embodiments of the present general inventive concept. Various exemplary reasons indicating why it is better to encrypt the information before the ECC will now be described in more detail with reference to FIGS. 4A through 4D.

Figure 4A:
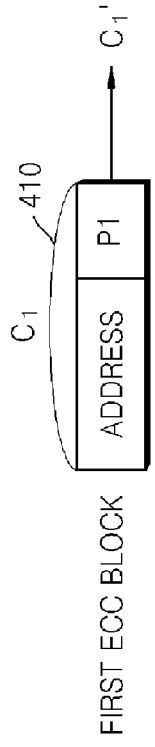
FIGS. 4A through 4D are diagrams illustrating cases of performing encryption of information, according to embodiments of the present general inventive concept.

Referring to FIG. 4A, $C_1$ 410 denotes a first ECC block generated by adding a first parity P1 to address information, and $C_1'$ denotes $C_1$ after encryption.

Figure 4B:
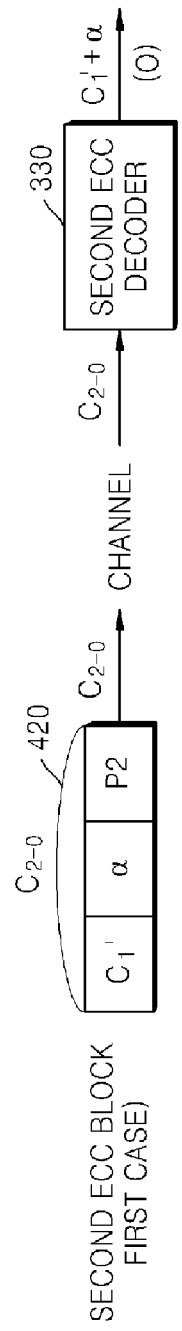

In a first case illustrated in FIG. 4B, additional information a may be attached to the encrypted first ECC block $C_1'$ and a second parity P2 may be attached thereto to generate a second ECC block $C_{2-0}$ 420. In a case in which the second ECC block $C_{2-0}$ passes through a channel and is input to the second ECC decoder 330, the second ECC decoder 330 may obtain message data formed of the encrypted first ECC block $C_1'$ and the additional information a without any problems since the first ECC block $C_1$ is encrypted in a first ECC level. However, since the encrypted first ECC block $C_1'$ is encrypted in such a way that an error cannot be corrected by the first ECC decoder 340, the first ECC decoder is unable to perform error correction successfully, and thus, is unable to obtain the proper first ECC block $C_1$. Accordingly, in this example, a conventional apparatus is prevented from reproducing the information.

Figure 4C:
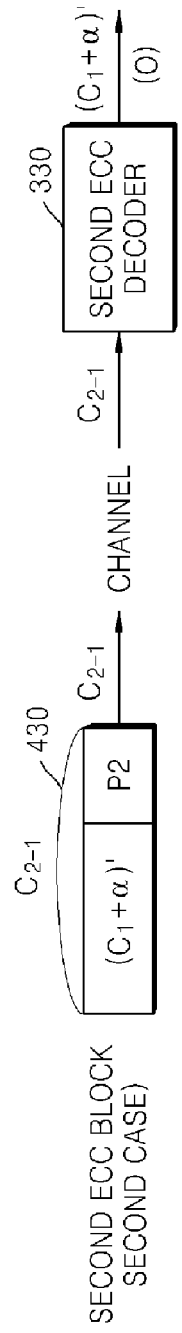

In a second case illustrated in FIG. 4C, additional information a may be attached to the first ECC block $C_1$ to prepare message data ($C_1+\alpha$), the message data may be encrypted, and then a second parity P2 may be attached to the encrypted message data ($C_1+\alpha$)' to generate a second ECC block $C_{2-1}$ 430. In a case in which the second ECC block $C_{2-1}$ is input to a second ECC decoder 330 through a channel, the second ECC decoder 330 may obtain the message data formed of ($C_1+\alpha$)' without any problems since $C_1$ is encrypted in a first ECC level. However, since ($C_1+\alpha$)' is encrypted in such a way that an error cannot be corrected by the first ECC decoder 340, the first ECC decoder is unable to perform error correction successfully, and thus, is unable to obtain the proper first ECC block $C_1$. Accordingly, in the second case, a conventional apparatus is prevented from reproducing the information.

Figure 4D:
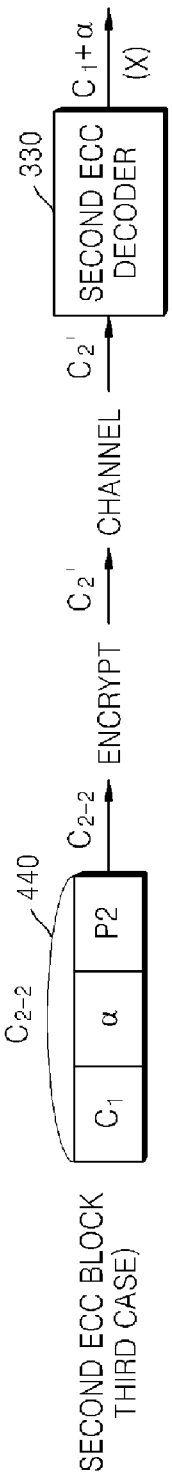

In a third case illustrated in FIG. 4D, additional information a may be attached to the first ECC block $C_1$, and then a second parity P2 may be attached thereto to generate a second ECC block $C_{2-2}$ 440. Then, the second ECC block $C_{2-2}$ may be encrypted to generate the encrypted second ECC block $C_2'$. When the encrypted second ECC block $C_2'$ is input to a second ECC decoder 330 through a channel, the second ECC decoder 330 considers the encryption performed on the second ECC block $C_{2-2}$ as an error and performs error correction. In this example, since a small amount of the second ECC block $C_{2-2}$ is encrypted, the second ECC decoder 330 having excellent error correction performance successfully performs the error correction even when an encryption error exists, thereby obtaining the message data formed of $C_1+\alpha$. Accordingly, $C_1$ may be obtained by extracting the additional information a from the message data formed of $C_1+\alpha$. Moreover, when $C_1$ is input to the first ECC decoder 340, accurate address information is extracted from $C_1$. Consequently, a conventional apparatus may obtain the address information, and thus, in the third case, it is not possible to prevent the conventional apparatus from reproducing the information.

In summary, in the first and second cases described above, wherein information encryption is performed before generating the second ECC block, information is prevented from being recorded or reproduced since the conventional apparatus is unable to perform error correction on encrypted information. However, in the third case, wherein information encryption is performed after generating the second ECC block, it is likely that the conventional apparatus may successfully perform the error correction on the encrypted information, and thus, the conventional apparatus may record or reproduce the information. Accordingly, in order to prevent the conventional apparatus from reproducing the encrypted information, the information may be encrypted before the generating of the second ECC block.

Figure 5:
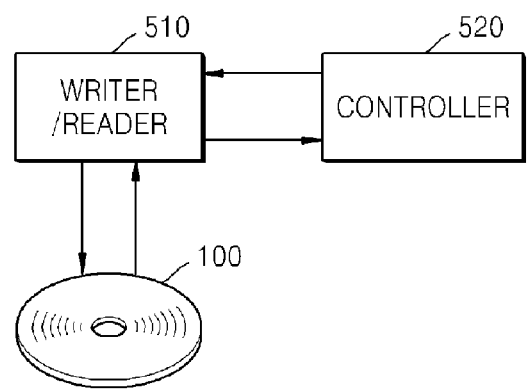
FIG. 5 is a schematic block diagram illustrating a recording/reproducing apparatus according to an embodiment of the present general inventive concept.

FIG. 5 is a schematic block diagram illustrating a recording/reproducing apparatus according to an embodiment of the present general inventive concept;

Referring to FIG. 5, the recording/reproducing apparatus may include a writer/reader 510 and a controller 520.

The writer/reader 510 may write data on an information storage medium according to an embodiment of the present general inventive concept, such as a disk 100, and may read data recorded on the disk 100, according to control by the controller 520.

The controller 520 may control the writer/reader 510 to record or read data on the disk 100. During a recording operation, the controller 520 may first ECC-encode and second ECC-encode information, and, during this process, a part of the first ECC-encoded information may be encrypted before the second ECC-encoding. During a reading operation, the controller 520 may second ECC-decode and first ECC-decode information read from the disk 100, and, during this process, the information may be decrypted after the second ECC-decoding.

A recording apparatus and a reproducing apparatus may be realized with separate apparatuses, or with one apparatus as illustrated in FIG. 5.

Figure 6:
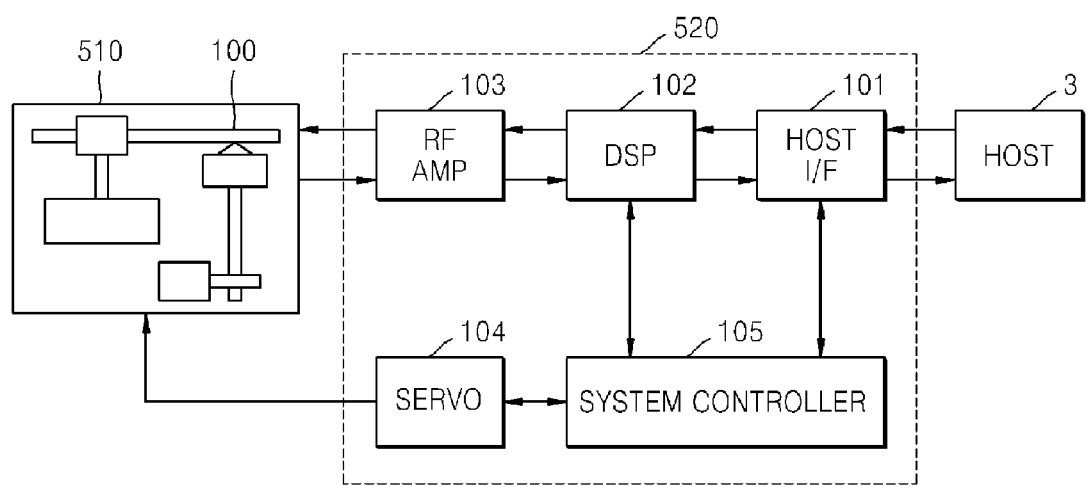
FIG. 6 is a block diagram illustrating a drive including the recording/reproducing apparatus of FIG. 5, according to an embodiment of the present general inventive concept.

FIG. 6 is a block diagram illustrating a drive including the recording/reproducing apparatus of FIG. 5, according to an embodiment of the present general inventive concept.

Referring to FIG. 6, the drive may include the writer/reader 510 as a pickup unit. The disk 100 may be provided to the pickup unit so that the write/read operations may be performed by the writer/reader 510. Also, the drive may include a host interface (I/F) 101, a digital signal processor (DSP) 102, a radio frequency (RF) amplifier (AMP) 103, a servo 104, and a system controller 105, as the controller 520.

During a recording operation, the host I/F 101 may receive a record command, with data to be recorded, from a host 3. The system controller 105 may perform an initialization required to record the data. The DSP 102 may ECC-encode the data received from the host I/F 101 by adding parity, or the like, used in error correction, and may then modulate the ECC-encoded data according to a predetermined method. The RF AMP 103 may change the data output from the DSP 102 into an RF signal. The recorder/reader 510 may record the RF signal output from the RF AMP 103 on the disk 100. The servo 104 may servo-control the recorder/reader 510 according to a command to servo-control received from the system controller 105.

During a reading operation, the host I/F 101 may receive a read command from the host 3. The system controller 105 may perform an initialization required for the reading operation. The writer/reader 510 may irradiate a laser beam onto the disk 100, and may output an optical signal obtained by receiving the laser beam reflected from the disk 100. The RF AMP 103 may change the optical signal output from the writer/reader 510 into an RF signal, and may provide modulated data obtained from the RF signal to the DSP 102 while providing a servo signal obtained from the RF signal to the servo 104. The DSP 102 may output data obtained by demodulating and performing ECC error correction on the modulated data. The servo 104 may perform servo-control on the writer/reader 510 according to the servo signal received from the RF AMP 103 and a command used in the servo-control that is received from the system controller 105. The host I/F 101 may transmit the data received from the DSP 102 to the host 3.

In more detail, the DSP 102 according to the current embodiment may perform ECC-encoding twice, and, at this time, the information may be encrypted before performing the second ECC-encoding, and may be decrypted after performing the second ECC-encoding. This will be described in more detail with reference to FIGS. 7A through 11.

Figure 7A:
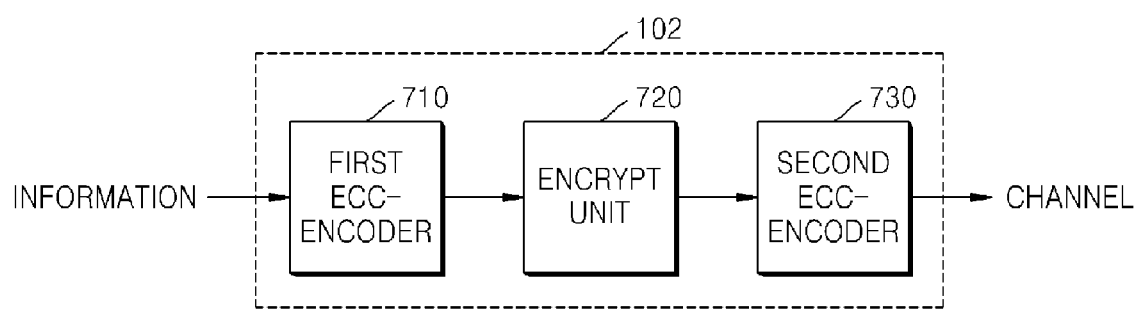
FIGS. 7A and 7B are diagrams each illustrating a digital signal processor of FIG. 6.
Figure 7B:
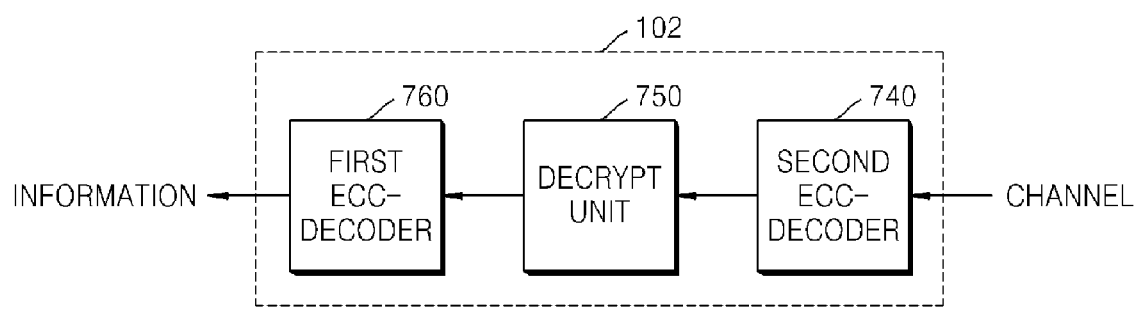

FIGS. 7A and 7B are diagrams each illustrating the digital signal processor 102 of FIG. 6.

Referring to FIG. 7A, the DSP 102 may include a first ECC-encoder 710, an encrypt unit 720, and a second ECC-encoder 730.

Referring to FIGS. 7A and 10, which is a flowchart illustrating an information encoding method according to an embodiment of the present general inventive concept, the first ECC-encoder 710 may receive information in operation 1010, and may first ECC-encode the received information in operation 1020. The first ECC-encoder 710 may use, for example, the RS (9,5,5) code as described with reference to FIG. 3B, and, thus, may receive 16 pieces of first message data of 5 bytes including an address unit number as the information, and may generate a first ECC block by attaching a first parity of 4 bytes to the first message data.

The encrypt unit 720 may encrypt at least a portion of the first ECC-encoded information, in operation 1030. In other words, a portion of bytes per codeword may be encrypted from the first ECC block received from the first ECC-encoder 710. In this example, an amount of the bytes may exceed the error correction performance of the first ECC encoder 710, so that the first ECC-encoder 710 is unable to successfully perform error correction. For example, in the RS (9,5,5) code, the portion of bytes may be 3 to 4 bytes. Here, the bytes may be encrypted by not only using a certain encryption method, but also by adding or subtracting a value or by performing an exclusive OR operation, thereby changing an original value of the first ECC-encoded information to another value. Accordingly, it would be obvious to one of ordinary skill in the art that the encrypt unit 720 may be referred to with other names, such as a changing unit or an encoder, as long as the encrypt unit 720 performs the above-described function. Herein, a decoding unit corresponding to the encrypt unit 720 is referred to as a decrypt unit.

The second ECC-encoder 730 may second ECC-encode the encrypted information received from the encrypt unit 720, in operation 1040, and may transmit the second ECC-encoded information through a channel. When the RS (62,30, 33) code described with reference to FIG. 3C is used, the second ECC-encoder 730 may receive the first ECC block, wherein the portion of bytes are encrypted, and may generate a second ECC block by attaching a second parity to the first ECC block. Referring to FIG. 3C, a second message data block of 24×30 bytes may be generated by attaching an additional information block to the first ECC block, and then a second ECC block of 24×62 bytes may be generated by attaching a second parity of 32 bytes per each codeword of the second message data block. FIG. 7A does not illustrate the attaching of the additional information block to the first ECC block since it is optional, and the attaching of the additional block to the first ECC block will be described with reference to FIGS. 8A through 9B.

FIG. 7B illustrates decoders included in the DSP 102 illustrated in FIG. 6.

In FIG. 7B, the DSP 102 may include a second ECC decoder 740, a decrypt unit 750, and a first ECC decoder 760.

Referring to FIGS. 7B and 11, which is a flowchart illustrating an information decoding method according to an embodiment of the present general inventive concept, the second ECC decoder 740 may receive a second ECC block that is a reproduction block, i.e., encoded information, through a channel, in operation 1110, and may second ECC-decode the second ECC block in operation 1120. In other words, the second ECC decoder 740 may obtain the original second message data, i.e., an encrypted first ECC block, through error correction.

The decrypt unit 750 may receive the encrypted first ECC block from the second ECC decoder 740, and may obtain a first ECC block by decrypting the encrypted first ECC block, in operation 1130.

The first ECC decoder 760 may receive the first ECC block, and may obtain the original first message data including an address unit number through error correction, in operation 1140.

In FIG. 7B, an arrangement of the first ECC decoder 760 may be optional. In other words, since the first ECC block may be message data of the second ECC block, when the second ECC-decoding is performed, errors in the first ECC block may be all corrected. Accordingly, address information may be obtained immediately after the second ECC-decoding and decrypting are performed, and, thus, the first ECC decoder 760 may or may not perform the first ECC-decoding.

Although not illustrated in FIG. 7B, a predetermined modulating process may be performed irrelevantly to the first ECC-decoding or the decrypting, before the second ECC decoder 740 receives the reproduction block through the channel.

Alternatively, the second ECC-decoding may be performed after modulating the reproduction block received through the channel. During the modulation, the received reproduction may be decrypted and first ECC-decoded to obtain the address information.

In summary, in FIG. 7A, the encrypting may be performed and then the second ECC-encoding may be performed since the conventional apparatus is unable to properly record or reproduce information on or from a disk using the encoding data format according to an embodiment of the present general inventive concept when the encrypting is performed before the second ECC-encoding as described above. However, in FIG. 7B, the first ECC-decoding may not be performed after the decrypting and second ECC-decoding, i.e., a reversed order of encoding, while decrypting the encrypted information, because, as described above, the address information without an error may be obtained by performing only the second ECC-decoding without having to perform the first ECC-decoding.

Figure 8A:
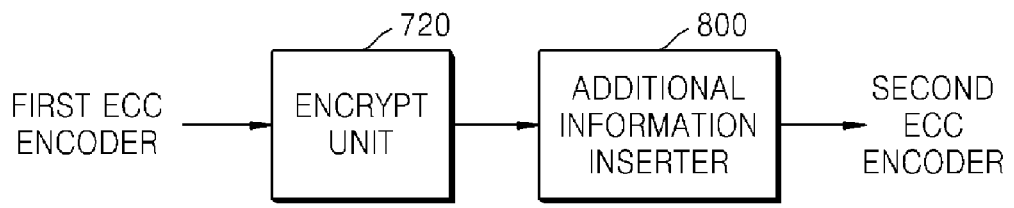
FIGS. 8A and 8B are diagrams illustrating exemplary encoders in a case in which an additional information block is attached to a first ECC block.
Figure 8B:
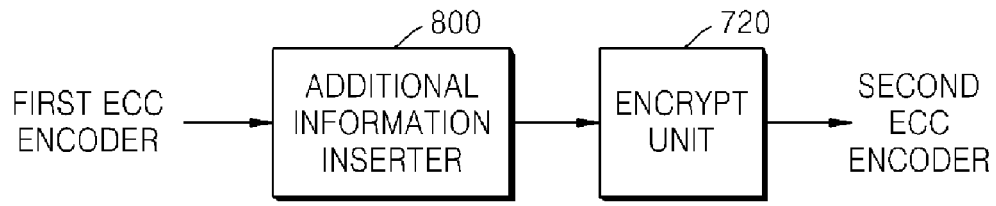

FIGS. 8A and 8B are diagrams illustrating exemplary encoders in a case in which an additional information block is attached to a first ECC block. FIG. 8A illustrates an example in which the additional information block may be inserted after encrypting the first ECC block, and FIG. 8B illustrates an example in which the additional information block may be inserted before encrypting the first ECC block.

Referring to FIG. 8A, the encrypt unit 720 may receive the first ECC block and encrypt at least portions of the information, and then an additional information inserter 800 may insert the additional information block into the encrypted first ECC block.

Referring to FIG. 8B, the additional information inserter 800 may insert the additional information block into the first ECC block that is encoded by a first ECC encoder, and then the encrypt unit 720 may encrypt the message data obtained by combining the first ECC block and the additional information block.

Figure 9A:
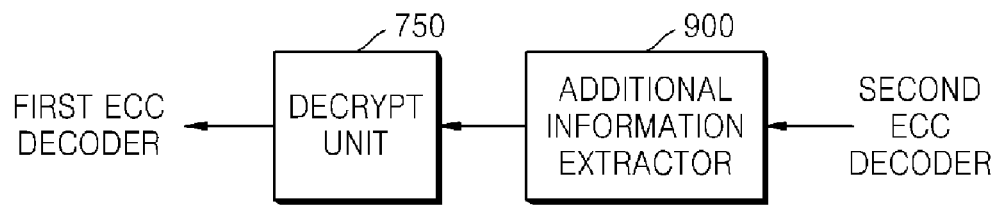
FIGS. 9A and 9B are diagrams illustrating exemplary decoders in a case in which an additional information block is attached to a first ECC block.
Figure 9B:
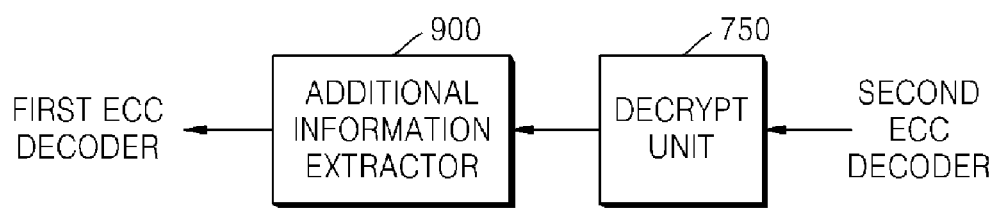

FIGS. 9A and 9B are diagrams illustrating exemplary decoders in a case in which an additional information block is attached to a first ECC block. FIG. 9A illustrates an example of decrypting the first ECC block after extracting the additional information block, according to the example of FIG. 8A, and FIG. 9B shows an example of extracting the additional information block after decrypting the first ECC block and the additional information block, according to the example of FIG. 8B.

Referring to FIG. 9A, an additional information extractor 900 may extract the additional information block from data received from a second ECC decoder and may obtain the first ECC block, and then the decrypt unit 750 may decrypt the first ECC block.

Referring to FIG. 9B, the decrypt unit 750 may obtain the first ECC block and the additional information block by decrypting data received from a second ECC decoder, and then the additional information extractor 900 may extract the additional information block from the first ECC block and the additional information block.

The system controller 105 may control the DSP 102 to perform the operations described above.

As previously discussed, FIG. 10 is a flowchart illustrating an information encoding method according to an embodiment of the present general inventive concept.

Referring to FIG. 10, the first ECC encoder 710 may receive information in operation 1010 and may generate a first ECC block by first ECC-encoding the information in operation 1020. The encrypt unit 720 may encrypt the first ECC block in operation 1030, and the second ECC encoder 730 may second ECC-encode the encrypted first ECC block in operation 1040. In this example, an additional information block may be further inserted into the first ECC block. In more detail, the additional information inserter 800 may insert the additional information block into the first ECC block in operation 1021 before operation 1030, or in operation 1031 after operation 1030.

As previously discussed, FIG. 11 is a flowchart illustrating an information decoding method according to an embodiment of the present general inventive concept.

Referring to FIG. 11, the second ECC decoder 740 may receive a second ECC block constituting encoded information in operation 1110 and may obtain an encrypted first ECC block by decoding the second ECC block in operation 1120. The decrypt unit 750 may decrypt the encrypted first ECC block to obtain a first ECC block in operation 1130. The first ECC decoder 760 may obtain original information by first ECC-decoding the first ECC block. In this example, if an additional information block has been further inserted into the first ECC block, the additional information block needs to be extracted. If the additional information block is inserted before encryption, the additional information extractor 900 may extract the additional information in operation 1131 after the decrypt unit 750 decrypts the encrypted first ECC block in operation 1130, and if the additional information block is inserted after the encryption, the additional information extractor 900 may extract the additional information in operation 1121 before the decrypt unit 750 decrypts the encrypted first ECC block in operation 1130.

Figure 12:
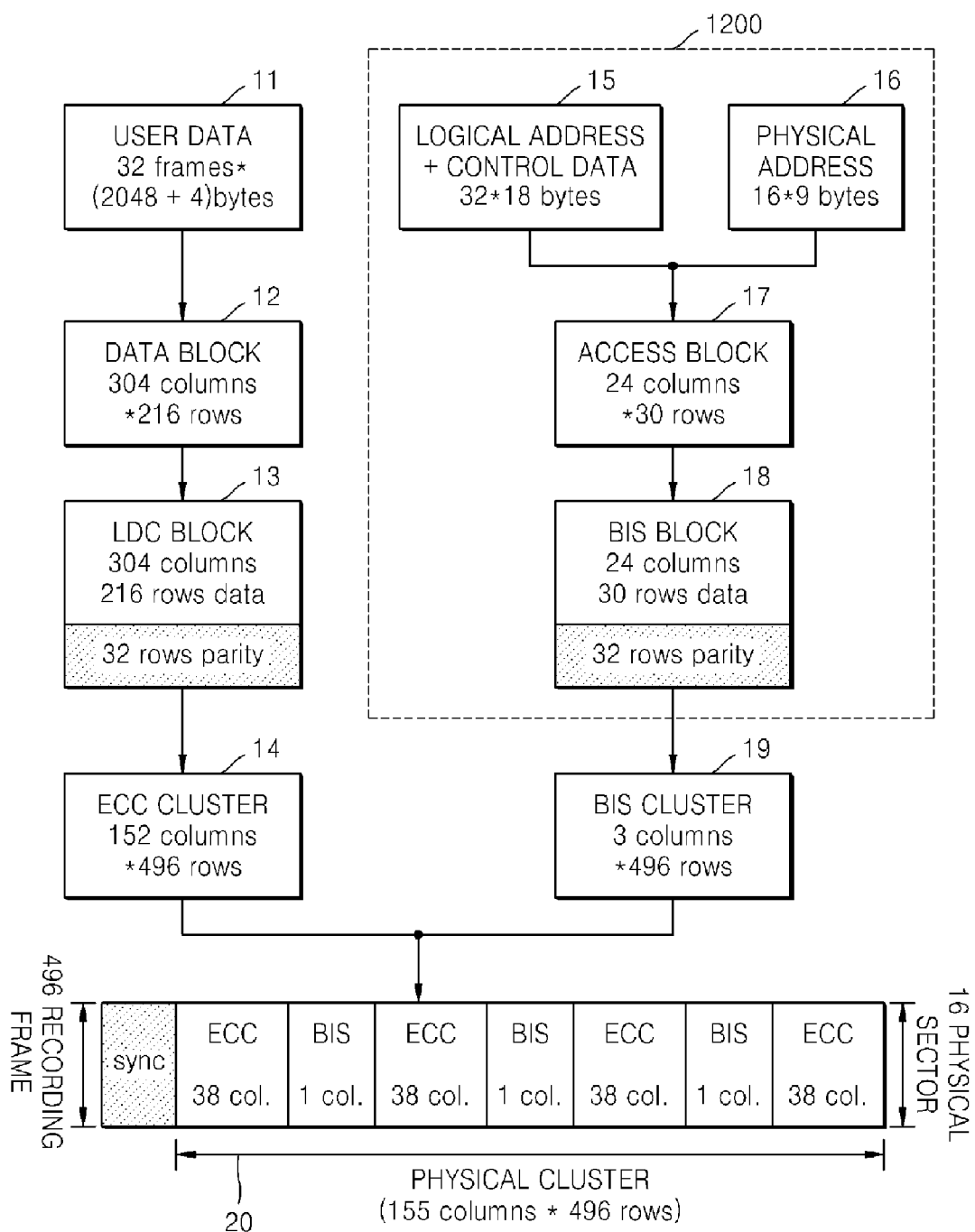
FIG. 12 is a diagram illustrating an encoding data format disclosed in U.S. Pat. No. 6,367,049.

FIG. 12 is a diagram illustrating an encoding data format described in U.S. Pat. No. 6,367,049.

Referring to FIG. 12, user data 11 received from a source, such as a host or an application, is divided into data frames each formed of 2048+4 bytes. The user data 11 forms a data block 12 arranged in 304 columns and 216 rows. Then, 32 row parities are added to the data block 12 to form a long distance (LDC) block 13. The LDC block 13 is arranged in 152 columns and 496 rows to form ECC clusters 14. The ECC clusters 14 are distributed and filled in an ECC area of a physical cluster block 20.

Logical address and control data 15, which are combined by a recording system, is arranged in 32×18 bytes. A physical address 16 related to a physical location on a medium is arranged in 16×9 bytes. The logical address and control data 15 and the physical address 16 combine with each together to form an access block 17 of 24 columns and 30 rows. Next, 32 row parities are added to the access block 17 to form a burst indicator subcode (BIS) block 18. The BIS block 18 is arranged in BIS clusters 19 of 3 columns and 496 rows. The BIS clusters 19 are distributed and filled in a BIS column of the physical cluster block 20. Also, a synchronization bit group of one column is added to the physical cluster block 20 to form a physical cluster of 155 columns and 496 rows. By arranging data according to such an interleaving method, an error correction performance may be improved.

An embodiment of the present general inventive concept may be applied to a section 1200 of the encoding data format of FIG. 12. The physical address 16 may denote a first ECC block obtained by first ECC-encoding message data including physical address information, and the BIS block 18 may denote a second ECC block obtained by second ECC-encoding the access block 17 by adding a parity.

Figure 13:
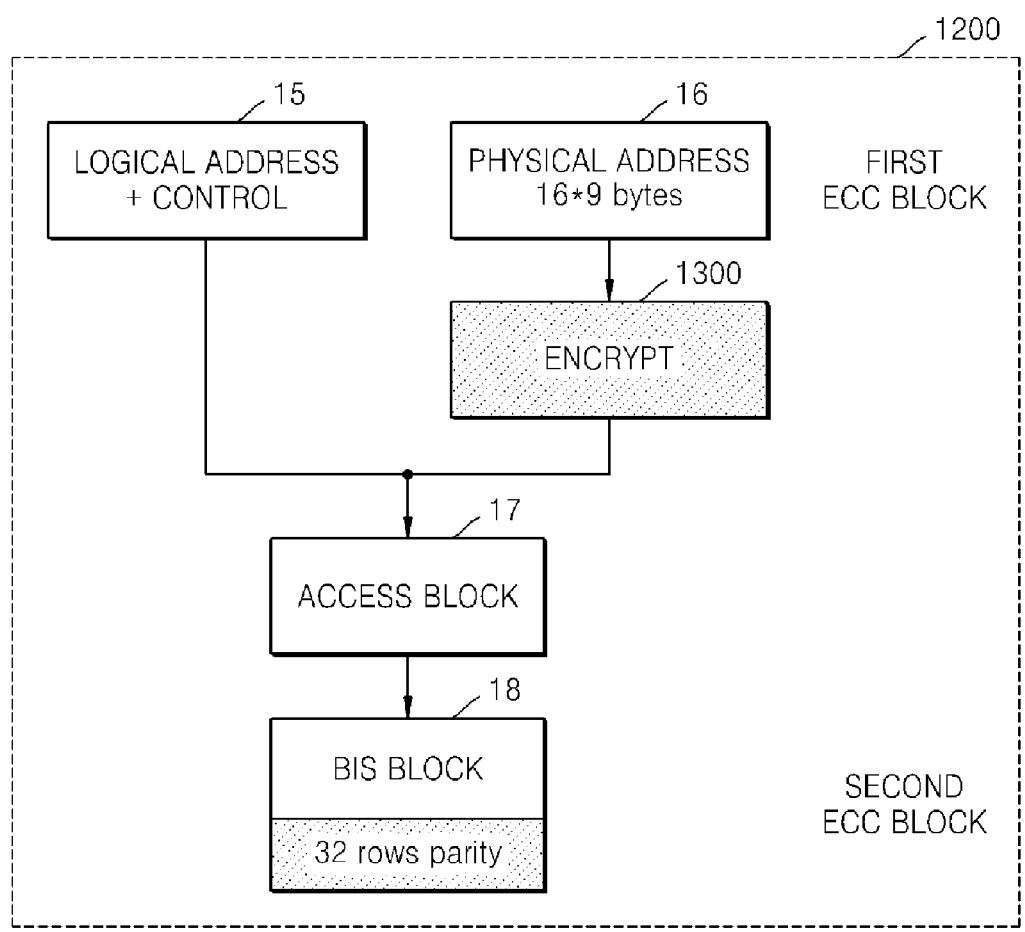
FIG. 13 is a diagram illustrating an example in a case in which an embodiment of the present general inventive concept is applied to a section of the encoding data format of FIG. 12.

FIG. 13 is a diagram illustrating an example in which an embodiment of the present general inventive concept is applied to the section 1200 of the encoding data format of FIG. 12. In FIG. 13, the physical address 16, i.e., the first ECC block, may be encrypted in the encryption operation 1300 illustrated in FIG. 13, the access block 17 may be generated by combining the logical address and the control data 15, which represent additional information, with the encrypted physical address 16, in the encryption operation 1300. Then, the access block 17 may be second ECC-encoded to generate a second ECC block.

Figure 14:
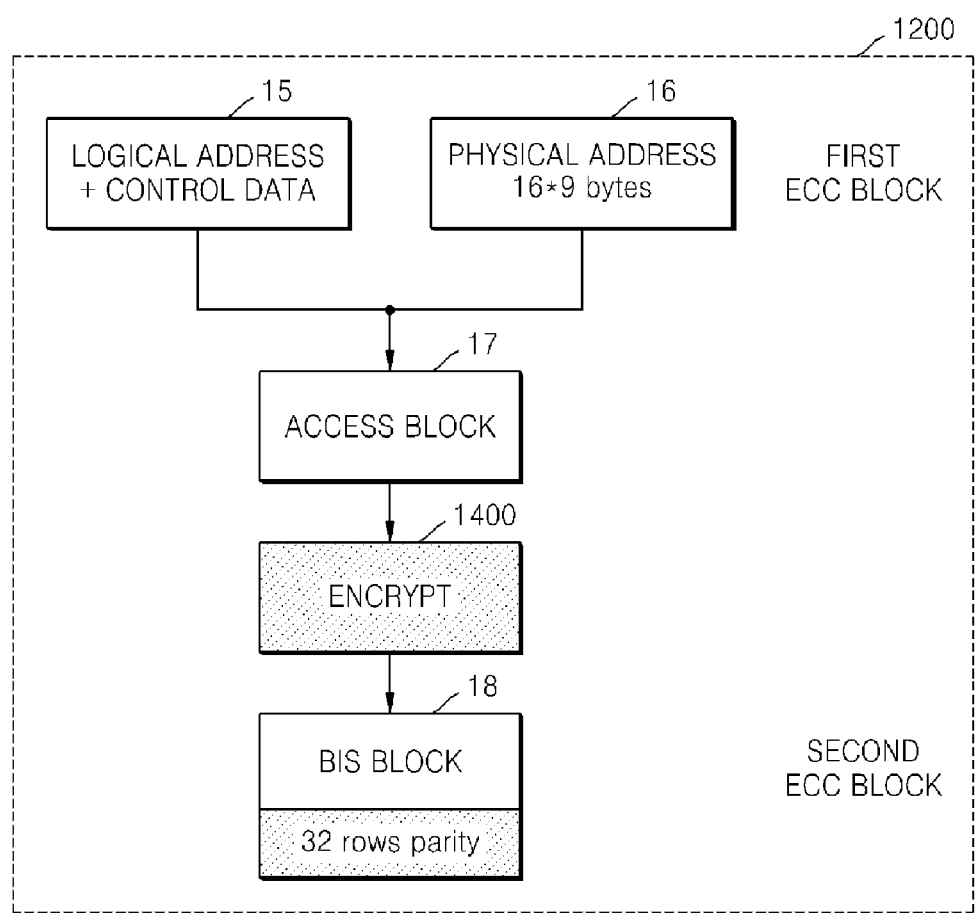
FIG. 14 is a diagram illustrating another example in a case in which an embodiment of the present general inventive concept is applied to the section of the encoding data format of FIG. 12.

FIG. 14 is a diagram illustrating another example of a case in which an embodiment of the present general inventive concept is applied to the section 1200 of the encoding data format of FIG. 12. In FIG. 14, the access block 17 may be generated by adding the physical address 16, i.e., the first ECC block, and the logical address and the control data 15, which represent the additional information, and the access block 17 may be encrypted in operation 1400. Next, second ECC-encoding may be performed after adding a parity to the encrypted access block 17 so as to generate a second ECC block.

In other words, when an embodiment of the present general inventive concept is applied to the section 1200 of FIG. 12, information may be encrypted before performing the second ECC-encoding as illustrated in FIGS. 13 and 14.

As described above, if the encrypting is performed after the second ECC-encoding, the encrypted information is considered to be an error by a second ECC decoder. Thus, when the information is reproduced in a conventional drive, the second ECC decoder, having excellent error correction performance, corrects all errors in the encrypted information, and thus, the conventional drive may obtain correct information. Accordingly, as described above, the information is encrypted before the second ECC-encoding.

According to the present general inventive concept, a portion of information of a first ECC block is encrypted before second ECC-encoding in a data encoding format applied to a drive of a newly developed standard or version, so that when a disk using the data encoding format is loaded in a conventional apparatus that does not use the new standard, the conventional apparatus is prevented from correcting errors of data of the disk, thereby effectively preventing the conventional apparatus from recording or reproducing information on or from the disk employing the newly developed standard.

The present general inventive concept can also be embodied as computer readable codes on a computer readable recording medium. The computer readable recording medium is any data storage device that can store data which can be thereafter read by a computer system. Examples of the computer readable recording medium include read-only memory (ROM), random-access memory (RAM), CD-ROMs, magnetic tapes, floppy disks, optical data storage devices, etc. The computer readable recording medium can also be distributed over network coupled computer systems so that the computer readable code is stored and executed in a distributed fashion. Also, functional programs, codes, and code segments for accomplishing the present invention can be easily construed by programmers skilled in the art to which the present invention pertains.

While the present general inventive concept has been particularly shown and described with reference to various exemplary embodiments thereof, it will be understood by those of ordinary skill in the art that various changes in form and details may be made therein without departing from the spirit and scope of the invention as defined by the appended claims. The embodiments should be considered in a descriptive sense only and not for purposes of limitation. Therefore, the scope of the invention is defined not by the detailed description of the invention but by the appended claims, and all differences within the scope will be construed as being included in the present general inventive concept.

What is claimed is:

1. An apparatus to form a physical cluster, the apparatus comprising:
a controller configured to
generate user data, and address information of the physical cluster,
first error correction code (ECC)-encode the address information by adding a first parity to the address information,
modulate the first ECC-encoded address information according to a predetermined criteria, and
add a second parity to the modulated address information; and
a pickup unit configured to form the physical cluster by interleaving the user data with the address information in which the second parity is added.

2. The recording apparatus of claim 1, wherein the controller inserts additional information to the first ECC-encoded address information before or after modulating the first ECC-encoded information.

3. The recording apparatus of claim 1, wherein the address information comprises an address unit number.

4. A reproducing apparatus to reproduce a physical cluster formed by interleaving user data with address information in which a second parity is added, the reproducing apparatus comprising:
a pickup unit to read the physical cluster from an information storage medium; and
a controller configured to reproduce the user data from the physical cluster,
wherein the address information in which the second parity is added generated by
generating the address information of the physical cluster,
first ECC-encoding the address information by adding a first parity to the address information,
modulating the first ECC-encoded address information according to a predetermined criteria, and
adding the second parity to the modulated address information.

5. A method of generating a physical cluster, the method comprising:
generating user data, and address information of the physical cluster;
first ECC-encoding the address information by adding a first parity to the address information;
modulating the first ECC-encoded address information according to a predetermined criteria;
adding a second parity to the modulated address information; and
forming the physical cluster by interleaving the user data with the address information in which the second parity is added.

6. The method of claim 5, wherein the modulating comprises inserting additional information to the first ECC-encoded address information before or after modulating the first ECC-encoded address information.

7. The method of claim 5, wherein the address information comprises an address unit number.

8. A method of reproducing a physical cluster formed by interleaving user data with address information in which a second parity is added, the method comprising:
reading the physical cluster from an information storage medium; and
reproducing the user data from the physical cluster,
wherein the address information in which the second parity is added generated by
generating the address information of the physical cluster,
first ECC-encoding the address information by adding a first parity to the address information,
modulating the first ECC-encoded address information according to a predetermined criteria, and
adding the second parity to the modulated address information.

9. A non-transitory information storage medium comprising:
user data; and
address information of a physical cluster;
wherein the physical cluster is formed by interleaving the user data with the address information in which a second parity is added,
wherein the address information in which a second parity is added is generated by
generating the address information of the physical cluster,
first ECC-encoding the address information by adding a first parity to the address information,
modulating the first ECC-encoded address information according to a predetermined criteria, and
adding the second parity to the modulated address information.

10. The information storage medium of claim 9, wherein additional information is inserted into the first ECC-encoded address information before or after the first ECC-encoded information is modulated.

11. The information storage medium of claim 9, wherein the address information comprises an address unit number.

* * * * *